United States Patent [19]

Moslehi

[11] Patent Number: 5,089,441
[45] Date of Patent: Feb. 18, 1992

[54] LOW-TEMPERATURE IN-SITU DRY CLEANING PROCESS FOR SEMICONDUCTOR WAFERS

[75] Inventor: Mehrdad M. Moslehi, Dallas, Tex.

[73] Assignee: Texas Instruments Incorporated, Dallas, Tex.

[21] Appl. No.: 509,251

[22] Filed: Apr. 16, 1990

[51] Int. Cl.$^5$ .......................................... H01L 21/306
[52] U.S. Cl. .................................... 437/225; 437/247; 437/248; 437/937; 437/946; 437/926; 148/DIG. 17; 134/1
[58] Field of Search ............... 437/946, 248, 247, 937, 437/225; 148/DIG. 17; 134/1

[56] References Cited

U.S. PATENT DOCUMENTS

| | | | |
|---|---|---|---|
| 3,765,763 | 10/1973 | Nygaard | 118/62 |
| 3,976,330 | 8/1976 | Babinski et al. | 406/88 |
| 4,027,246 | 5/1977 | Caccoma et al. | 29/430 |
| 4,870,030 | 9/1989 | Markunas et al. | 437/85 |

FOREIGN PATENT DOCUMENTS

| | | | |
|---|---|---|---|
| 0155526 | 12/1981 | Japan | 437/937 |
| 2095704 | 10/1982 | United Kingdom | 148/DIG. 17 |

OTHER PUBLICATIONS

Yew and Reif, "Silicon Selective Epitaxial Growth at 800° C. Using SiH4/H2 Assisted by H2/Ar Plasma Sputter", *Appl. Phys. Lett.* 55 (10), Sep. 4, 1989.
Suzuki and Itoh, "Effect of Si-Ge Buffer Layer for Low-Temperature Si Epitaxial Growth on Si Substrate by rf Plasma Chemical Vapor Deposition", *J. Appl. Phys.* 54(3), Mar., 1983.
Morar, Meyerson, Karlsson, Himpsel, McFeely, Rieger, Taleb-Ibrahimi and Yarmoff, "Oxygen Removal from Si via Reaction with Adsorbed Ge", *Appl. Phys. Lett.* 50(8), Feb., 1987.
Shibata, Kondo and Nanishi, "Si Surface Cleaning and Epitaxial Growth of GaAs on Si by Electron Cyclotron Resonance Plasma-Excited Molecular-Beam-Epitaxy at Low Temperatures", *J. Electrochem. Soc.*, vol. 136, No. 11, Nov., 1989.
Saito, Yamaoka and Yoshida, "Plasmaless Cleaning Process of Silicon Surface Using Chlorine Trifluoride", *App. Phys. Lett.* 56(12), Mar. 19, 1990.

*Primary Examiner*—Olik Chaudhuri
*Assistant Examiner*—Ourmazd S. Ojan
*Attorney, Agent, or Firm*—Douglas A. Sorensen; Richard L. Donaldson; William E. Hiller

[57] ABSTRACT

A low-temperature (650° C. to 800° C.) in-situ dry cleaning process (FIG. 2) for removing native oxide (and other contaminants) from a semiconductor surface can be used with either multi-wafer or single-wafer semiconductor device manufacturing reactors. A wafer is contacted with a dry cleaning mixture of germane GeH4 and hydrogen gas (51), such that the germane:hydrogen flow ratio is less than about 0.15:12000 sccm. The dry cleaning mixture can include a halogen-containing gas (such as HCl or HBr) (52, 54) to enhance cleaning of metallic contaminants, and/or anhydrous HF gas (53, 54) to further lower the process temperature. The dry cleaning process can be achieved by introducing some or all of the hydrogen and/or an inert gas as a remote plasma. The dry cleaning process is adaptable as a precleaning step for multiprocessing methodologies that, during transitions between process steps, reduce thermal cycling (FIGS. 3c-3e) by reducing wafer temperature only to an idle temperature (350° C.), and by reducing vacuum cycling by maintaining flow rates for constant gases (FIG. 3c), thereby substantially reducing thermal stress and adsorption of residual impurities, while limiting dopant redistribution.

7 Claims, 7 Drawing Sheets

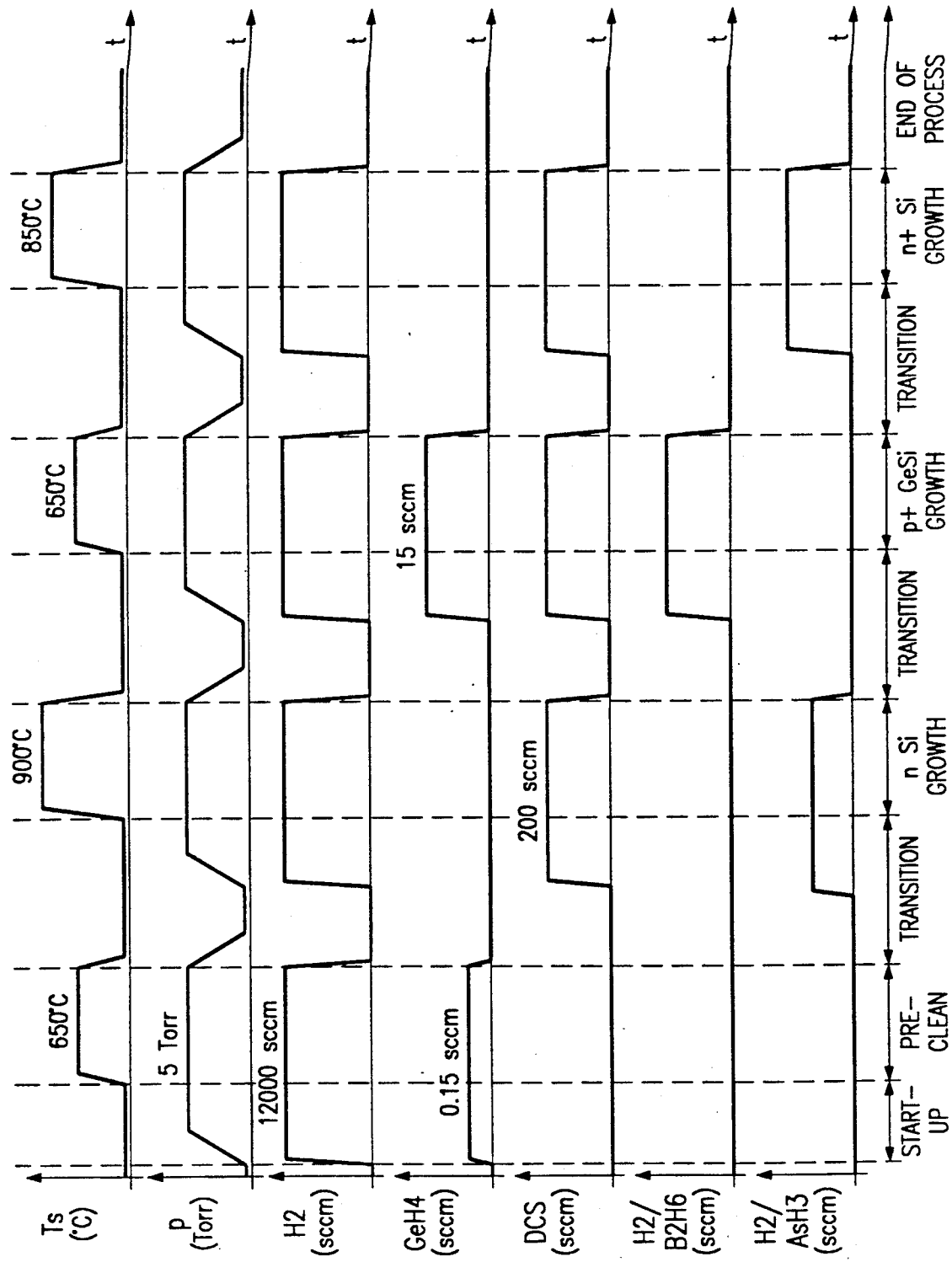

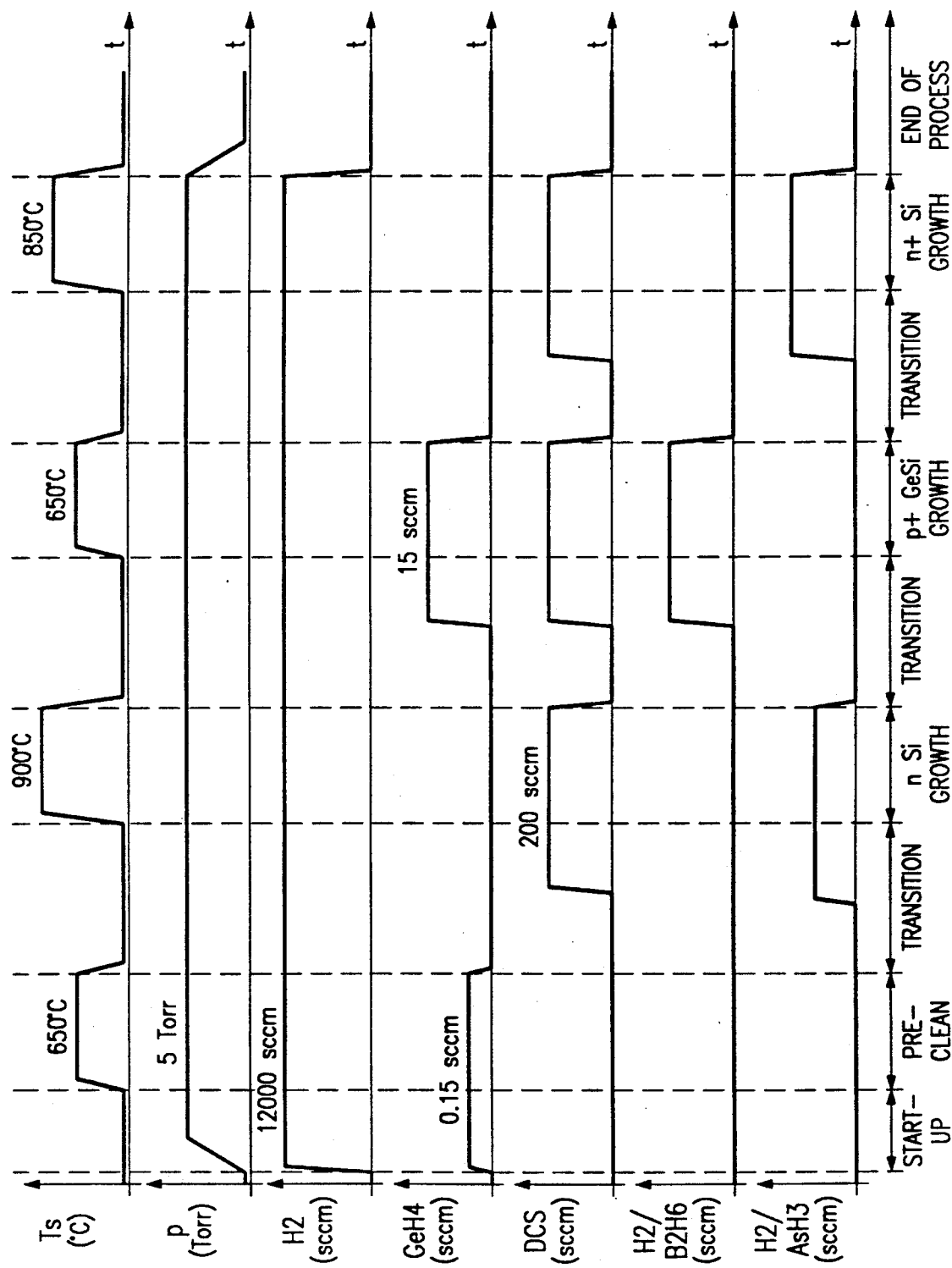
FIG. 3b (PRIOR ART) METHODOLOGY B

METHODOLOGY C

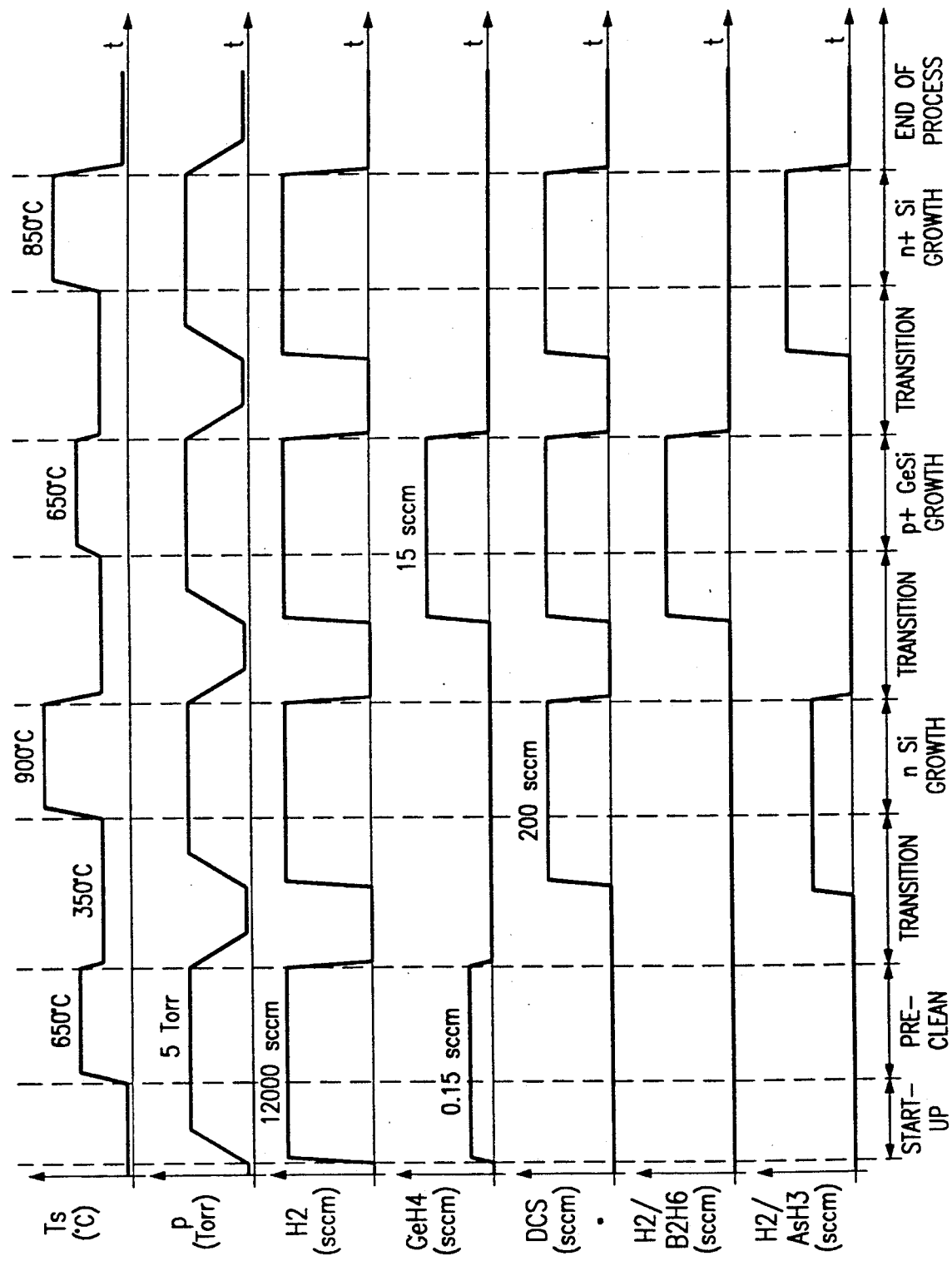
FIG. 3d METHODOLOGY D

METHODOLOGY E

LOW-TEMPERATURE IN-SITU DRY CLEANING PROCESS FOR SEMICONDUCTOR WAFERS

GOVERNMENT RIGHTS

The U.S. Government has a paid up license in this invention and rights in limited circumstances to require the patent owner to license others on reasonable terms as provided for by the terms of Contract Number F.33615-88-C-5448 awarded by the Department of Applied Research and Programs Administration.

TECHNICAL FIELD OF THE INVENTION

The invention relates generally to semiconductor device fabrication, and more particularly relates to a process for low-temperature in-situ dry cleaning (such as to remove native oxide layers and other surface contaminants) of a semiconductor wafer under fabrication. In even greater particularity, the invention relates to the use of such a low-temperature in-situ dry cleaning process in connection with multiprocessing methodology for semiconductor device fabrication with reduced process parameter cycling.

BACKGROUND OF THE INVENTION

Fabricating various metal-oxide-semiconductor (MOS) and bipolar devices, which employ high-quality epitaxial structures or polysilicon contacts to doped single-crystal silicon regions, requires effective pre-process cleaning of the semiconductor surface to remove thin native oxide layers and other contaminants (such as residual metallic and organic impurities).

In particular, undesirable native oxide layers, 5-30 Angstroms, thick are grown on the semiconductor surface as a result of various wet chemical treatments (such as nitric acid or cleaning) and other fabrication procedures, or even exposure to ambient air during wafer handling between process steps. The thickness of these native oxide layers depends upon the source; for example, oxides resulting from ambient exposure are usually less than about 12 Angstroms, chemically grown oxides resulting from exposure to ammonium hydroxide-hydrogen peroxide are usually less than about 17 Angstroms, and oxides resulting from hot nitric acid are usually less than about 30 Angstroms.

The common procedure for removing native oxides (and other contaminants) prior to epitaxial silicon growth processes involves an ex-situ aqueous cleaning (such as the so-called RCA cleaning followed by a final HF dip), followed by an in-situ high-temperature (around 1000° C.-1200° C.) $H_2$ bake. The wet clean step is expected to remove most of the native oxide and other trace contaminants, while the high-temperature $H_2$ pre-bake removes residual native oxide left on the semiconductor surface due to ambient exposure. In some applications, the in-situ prebake process may employ an $H_2+HCl$ process ambient. However, an $H_2+HCl$ pre-bake is not suitable for low temperature native oxide removal applications due to the possible surface etch-pit problems.

The conventional native-oxide removal procedure has a number of disadvantages and limitations. The wet cleaning processes requires careful control which impacts process reproducibility, and large amounts of chemicals are consumed by the aqueous cleaning process. Moreover, these cleaning chemicals must be disposed of in accordance with increasingly stringent environmental regulations. The $H_2$ pre-bake processes require relatively high substrate temperatures which cause significant dopant redistribution and undesirable structural modifications in semiconductor devices.

Another disadvantage that is becoming increasingly significant is that the ex-situ wet cleaning steps can not be easily integrated with the subsequent gas-phase processing reactors (such as the reactor for an epitaxial growth process) or vacuum integrated processing cluster tubes. This characteristic of ex-situ cleaning processes can result in fabrication yield reduction due to repeated exposure of wafers to ambient air and insufficient device manufacturing automation.

Moreover, ex-situ cleaning processes do not take advantage of the capabilities of single-wafer integrated in-situ multiprocessing (SWIM) reactors. SWIM is a processing/equipment technology that allows integration of several reactive processing steps in one wafer processing chamber for controlled formations of a desired device microstructure without removing the wafer between various fabrication steps. The SWIM equipment technology and multiprocessing methodology offer enhanced equipment utilization, improved process reproducibility and yield, and reduced chip manufacturing cost.

The conventional multiprocessing methodology employed for an epitaxial multilayer structure involves cycling process parameters—substrate temperature, chamber pressure and process gas flow rates—off and on in transitioning between adjacent process steps (such as depositions of silicon, silicon-germanium alloys, dielectrics and polysilicon). That is, during the transition after the end of a process step, the heating lamp is turned off, and usually, gas flows are shut off and the process chamber is pumped down. When process gases have been shut off and the chamber pumped down, the transition period is completed by turning on the process gases for the subsequent process step and stabilizing chamber pressure and process ambient before turning on the heating lamp to achieve the desired wafer temperature in order to drive the next process step.

This process methodology has a number of possible disadvantages. Thermal cycling from process temperatures to a lamp-off condition may result in thermal shock that can damage the wafer and reduce device fabrication yields. Maintaining the wafer at room temperature during transitions increases the adsorption of residual vacuum impurities ($O_2$, $H_2O$ and hydrocarbons). This contaminant adsorption problem is particularly magnified if process gases are shut down and the chamber is pumped down to near vacuum. Vacuum cycling (pumping and venting) is also a significant source of particulate contamination in the process chamber and on the wafer surface.

Taking full advantage of the SWIM technology capabilities requires development of appropriate dry in-situ cleaning processes, which can eliminate the need for wet cleaning processes. In addition, multiprocessing methodologies would be optimized if the adverse effects of process parameter cycling could by minimized.

Thus, an alternative to the conventional ex-situ wet clean/in-situ $H_2$ bake processes used for such applications as epitaxial growth would be advantageous for both multiwafer (batch) and single-wafer (e.g., SWIM) semiconductor fabrication techniques. A number of dry oxide removal procedures have been proposed as an alternative to ex-situ wet cleaning; however, all have certain limitations or disadvantages.

One alternative native oxide removal procedure is based on heating the semiconductor silicon wafer in an ultra-high vacuum (UHV) process chamber (with a vacuum base pressure of $1 \times 10^{-8}$ Torr at substrate temperatures in the range of 800° C. to 1000° C. The temperature for this procedure can be lowered by chemical enhancement to around 625°–700° C. through pre-deposition of a sub-monolayer of germanium on the surface prior to UHV heating. Germanium atoms on the silicon surface can break the silicon-oxygen bonds in native oxide layers, thereby producing new chemical species which sublimate at 625° C. In absence of germanium, the native oxide layers are stable in UHV heating environments well in excess of 750° C. Even at the lower temperature, this procedure requires expensive UHV equipment technology, and is only useful for thin native oxide layers of about 10 Angstroms (compared to typical native oxide thicknesses of up to 30 Angstroms or more).

A second alternative process uses low-energy Ar plasma sputtering at temperatures on the order of 850° C., although process temperatures can be lowered to around 700°–800° C. by using an $Ar/H_2$ plasma. This procedure requires plasma sputtering deposition equipment, and introduces the potential for residual sputtering-induced damage to the semiconductor surface, which can result in defects in the subsequently grown epitaxial layers.

A third alternative process uses a remote $H_2$ plasma at relatively low temperatures of around 400° C. or less. This process operates at temperatures low enough to avoid any significant dopant redistribution, but is only useful for thin native oxide layers of less than about 10 Angstroms.

A fourth alternative dry oxide removal process has been proposed that does not necessarily involve complete pre-process removal of the native oxide, but rather its partial removal and suppression of its undesirable effects by deposition of a buffer layer prior to the expitaxial growth process. In connection with plasma-enhanced epitaxial growth of GeSi alloy films at a substrate temperature of 750° C., it has been observed that the addition of a small amount of Ge to Si (and growing a GeSi buffer layer) improves the crystallinity of the grown epitaxial layers. Based on this observation, the crystalline quality of epitaxial Si layers grown on a GeSi buffer layer containing a few percent Ge has been investigated using a plasma deposition process in which $GeH_4$ is added to the $SiH_4$ process ambient during the initial stage of epitaxial Si growth in order to make a buffer GeSi layer of about 1000 Angstroms containing 0.6–5 percent Ge. The use of this GeSi buffer layer by addition of a small amount of $GeH_4$ to $SiH_4$ during he initial stage of the process results in good-quality Si epitaxy. This effect has been attributed to the possible removal of the native oxide layer by the reaction of $Ge + SiO_2$ to form volatile $GeO_2$ and $GeO$ species. This method depends on the growth of a buffer layer containing Ge prior to the epitaxial Si growth in a plasma CVD reactor.

A fifth alternative process uses an electron cyclotron resonance (ECR) plasma of low energy (50–300 eV) $H_2$ or $H_2 + SiH_4$. This process accomplishes native oxide removal at relatively low temperatures of about 650° C., mostly by ion-activated chemical reduction reactions with little sputtering action, but requires a dedicated ECR plasma processing reactor. Oxide removal is possibly via formation of SiO and SiH volatile species. The in-situ ECR-$H_2$ plasma cleaning temperature has been as low as 200° C.

A sixth alternative native oxide removal process is not completely dry, but rather, uses a mixture of HF gas and water vapor. While not aqueous, the $HF + H_2O$(vapor) process stream is still highly corrosive, and requires a dedicated process chamber with special reactor wall passivation layers. The HF-vapor etch processes can remove relatively thick layers of oxide; however, it has been shown that they can result in formation of surface residues and particulates.

A seventh alternative native oxide removal technique is based on the use of fluorine-containing species in the process environment. Various non-plasma and plasma processes based on $CF_4$, $NF_3$, $ClF_3$ and $GeF_4$ have been proposed for silicon surface cleaning and native oxide removal. These processes can remove native oxide layers via plasma and/or thermal activation under the chemical action of the fluorine species. However, these processes generally offer poor etch selectivities with respect to Si such that the native oxide removal process may also remove a significant amount of Si in the exposed regions of the wafer. The fluorine-based chemistries may also result in undesirable Si-F surface bonds causing defective epitaxial layers, and may attack the reactor walls.

Accordingly, a need exists for an in-situ dry cleaning process for removing native oxide and other contaminants which is effective at temperatures sufficiently low (e.g. below 750° C.) to avoid significant dopant redistribution. Preferably, such a process could be integrated with conventional semiconductor processing equipment such as epitaxial growth reactors, as well as the low-pressure chemical-vapor deposition (CVD equipment, and in particular, could be integrated with a multiprocessing methodology that offers reduced process parameter cycling.

SUMMARY OF THE INVENTION

The invention is a low-temperature in-situ dry cleaning process for removing native oxide (and other contaminants) from a semiconductor (silicon) surface. The process can be used with either multi-wafer or single-wafer semiconductor device manufacturing reactors, and in particular, can be used as a pre-cleaning step in a multiprocessing methodology that reduces process parameter cycling.

In one aspect of the invention, the low-temperature in-situ dry cleaning process is used to remove native oxide and other contaminants (such as trace metallic impurities) from the surface of a semiconductor wafer under fabrication. The wafer is placed in a process environment (such as a process vacuum chamber) in which the substrate temperature is under about 900° C. The dry cleaning process then includes contacting the wafer with a dry cleaning environment of germane ($GeH_r$) and hydrogen ($H_2$), gas, such that the flow ratio is less than about 0.6 sccm:6000 sccm $GeH_4:H_2$.

The dry cleaning process can be plasma activated by introducing some or all of the hydrogen as a remote plasma stream. When using hydrogen plasma, the germane gas and any non-plasma hydrogen can be introduced into the afterglow of the plasma discharge inside the process chamber. Alternatively, instead of an $H_2$ plasma, an inert-gas plasma (such as remote Ar or He plasma) can be used to provide process activation, thereby minimizing damage to the quartz plasma tube due to reactive metastable hydrogen atoms (and associated particulate contamination problems)—in this case the non-plasma GeH$_4$+H$_2$ gas mixture is introduced into the afterglow of the plasma discharge inside the process chamber.

Preferably, the wafer temperature will be in the range of 600° C. to 850° C., and the germane:hydrogen flow ratio will be about 0.15 sccm:12000 sccm. Also, the dry cleaning process will be performed with a process chamber pressure of about 5 Torr.

In other aspects of the invention, the dry cleaning mixture can include a halogen-containing gas (such as HCl or HBr) to enhance removal of metallic contaminants, and/or a small flow of anhydrous HF gas to further lower the oxide removal process temperature. Some or all of the HCl/HBr and/or HF gases can be introduced as a remote plasma, although non-plasma injection of these gases directly into the process chamber is preferred. Preferably, the HCl/HBr: H$_2$ flow ratio is less than about 50 sccm:12000 sccm, and the HF:H$_2$ flow ratio is less than about 10 sccm:12000 sccm.

The low-temperature in-situ dry cleaning process of the invention is adaptable to a multiprocessing methodology using reduced process parameter cycling. In one aspect of that methodology, thermal cycling is substantially reduced by, during each transition between adjacent process steps, maintaining wafer temperature at level high enough to substantially reduce adsorption of residual vacuum contaminants on the surface, and low enough to prevent any thermally-activated film deposition due to reactive process gases and/or dopant redistribution.

Preferably, thermal cycling reduction is accomplished by reducing wafer temperature to an idle temperature (such as about 300°–450° C. for epitaxial processing applications) that is low enough to avoid substantial film deposition and substantial dopant redistribution. Further multiprocessing advantages can be obtained by reducing vacuum cycling by, during each transition between process steps in which at least one of the process gases is a common process gas used in each of the steps (such as hydrogen in epitaxial processing), maintaining the gas flow for such common process gas at substantially the same flow rate, and maintaining the process chamber pressure substantially the same as the nominal process pressure during all the cycles.

The technical advantages of the invention include the following. The low-temperature in-situ dry cleaning process provides an alternative to a wet cleaning and in-situ H$_2$ pre-bake process for removing native oxides (and other contaminants), eliminating the need for wet chemicals and high processing temperatures (1000° C. to 1200° C.). The dry cleaning process can be used prior to epitaxial growth, polysilicon deposition, gate dielectric formation, or other procedures used as part of the device manufacturing process sequence.

The low-temperature in-situ dry cleaning process requires relatively low temperatures, thereby minimizing dopant redistribution and the detrimental thermal stress effects in semiconductor wafers. Because the process can be performed in-situ, it can be integrated sequentially with subsequent epitaxial growth or deposition processes in the same chamber or in cluster tools, and is compatible with either multi-wafer or single-wafer (including SWIM) fabrication. The process can be enhanced for trace metallic removal by including a halogen-containing gas in the cleaning mixture, and process temperatures can be reduced by including an HF gas in the cleaning mixture. The process can be plasma-activated by introducing some or all of the medium gases (i.e., those gases other than germane) as a plasma.

The low-temperature in-situ dry cleaning process is adaptable to use as a pre-cleaning step for a multiprocessing methodology that reduces process parameter cycling. Reducing thermal cycling by maintaining, during step-to-step transitions, wafer temperatures at an idle temperature at which adsorption of residual vacuum impurities and deposition of films is avoided, not only reduces thermal shock and provides cleaner interfaces, but also increases process throughput. Maintaining the wafer temperatures at an idle hot temperature (such as 350° C.) during the transition periods can eliminate adsorption of residual contaminants, and in addition, significantly reduces dopant redistribution to maintain the desired device junction profiles. Reducing vacuum cycling by maintaining, during transitions, gas flow rates for the process gases used by all the steps in a multiprocessing sequence, and maintaining process chamber pressure at the nominal process pressure, reduces the particulate contamination that results from pumping down the process chamber, and in addition, increases process throughput. It also provides for continuous purging of the residual vacuum contaminants.

BRIEF DESCRIPTION OF THE DRAWINGS

For a more complete understanding of the invention, and for further features and advantages, reference is now made to the following Detailed Description, taken in conjunction with the accompanying Drawings, in which:

FIGS. 3a–3e are process flow diagrams illustrating multiprocessing methodologies in combination with the low-temperature in-situ dry cleaning process of the invention, with FIGS. 3a–3b illustrating prior art methodologies, and FIGS. 3c–3e illustrating methodologies with reduced process parameter cycling according to the invention.

DETAILED DESCRIPTION OF THE INVENTION

The Detailed Description of exemplary embodiments of the low-temperature in-situ dry cleaning process of the invention is organized as follows:
1. Germane-Assisted Dry Cleaning
2. Exemplary Process Reactor
3. Dry Cleaning Process
   3.1. Germane/Hydrogen
   3.2. HCl/HBr Additive
   3.3. HF Additive
   3.4. Plasma Activation
4. Multiprocessing Methodologies
5. Conclusion
1. Germane-Assisted Dry Cleaning.

In the exemplary embodiments, the low-temperature in-situ dry cleaning process of the invention uses germane (GeH$_4$) gas for removing native oxides and other contaminants (such as trace metals and organic impurities) from a semiconductor surface prior to epitaxial growth or other deposition procedures.

The germane-assisted dry cleaning process is effective at relatively low process temperatures in the range of 650° C. to 800° C., minimizing dopant redistribution. The in-situ germane-assisted dry cleaning process eliminates the need for ex-situ wet cleaning steps, making it adaptable for in-situ integrated multi-wafer or single-wafer device fabrication equipment. The germane-assisted dry cleaning process employs a $GeH_4/H_2$ process gas mixture. The $GeH_4:H_2$ flow ratio and process temperature can be optimized such that the pre-cleaning process removes the native oxide layers without depositing or leaving any germanium atoms on the surface.

The dry cleaning process can be further extended or enhanced through the introduction of suitable additives, such as HCl/HBr or anhydrous HF, or the use of plasma activation (or photon activation).

The possible mechanism for reduction of the native oxide is a chemical reaction between $GeH_x$ species and the native oxide forming volatile reaction byproducts such as germanium oxide and silicon monoxide. The germanium-containing species ($GeH_x$) can react with native oxide layers ($SiO_x$: $X=1-2$) and remove them via chemical formation of SiO, $SiH_x$, $GeO_2$ and GeO volatile species. The cleaning process parameters are optimized such that no residual Ge atoms are deposited on the wafer surface during the clean-up process.

2. Exemplary Process Reactor

For the exemplary embodiments, the germane-assisted low-temperature in-situ dry cleaning process is performed in an advanced vacuum multiprocessing (AVM) reactor used for single-wafer in-situ multiprocessing (SWIM).

Figure 1:
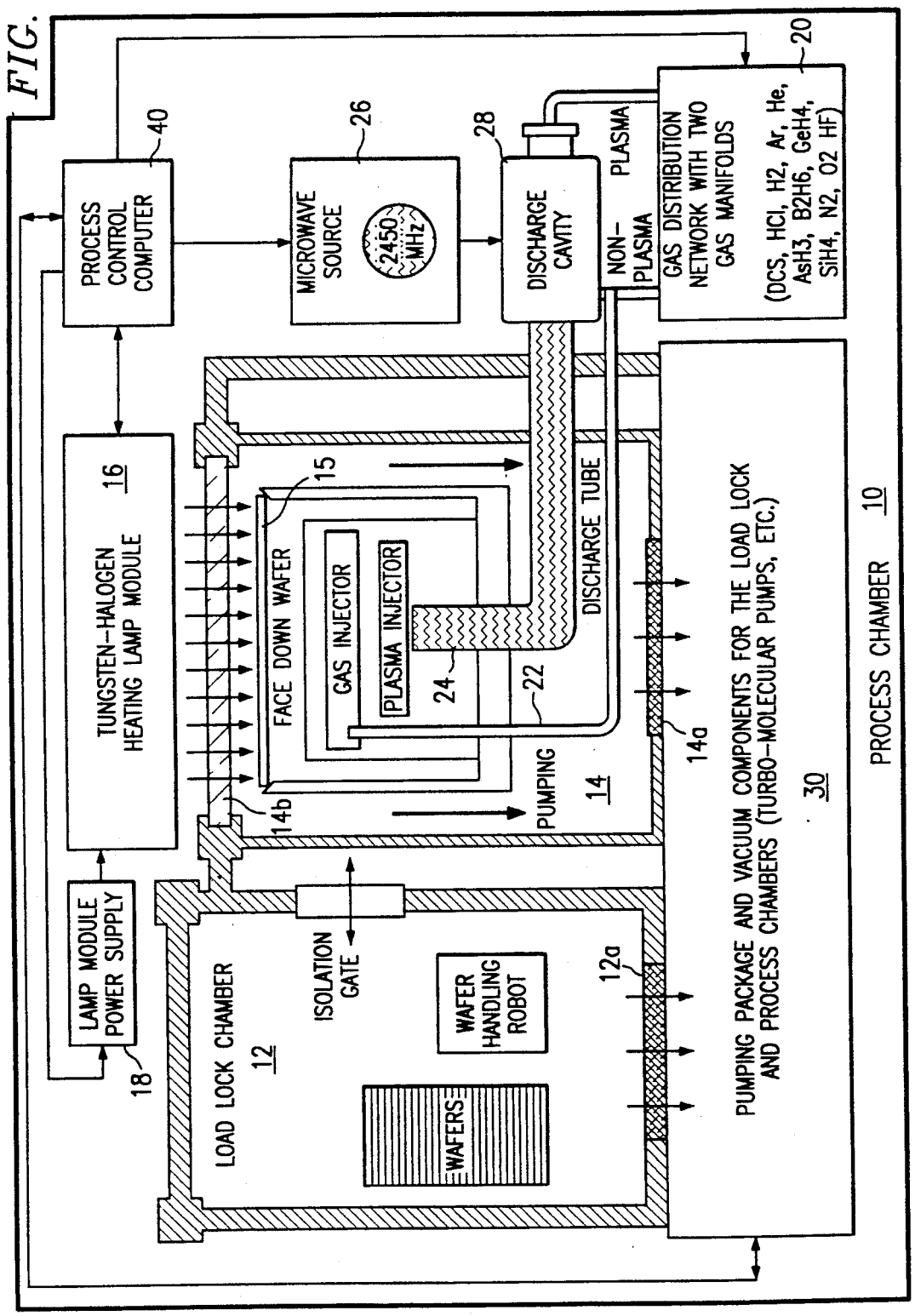
FIG. 1 illustrates an exemplary advanced/automated vacuum multiprocessing reactor in which the low-temperature in-situ dry cleaning process of the invention can be performed in conjunction with silicon and silicon-germanium alloy epitaxial growth processes.

FIG. 1 illustrates an AVM reactor 10, which includes a load lock chamber 12 and a process chamber 14 with facedown wafer positioning. Each chamber includes respective vacuum couplings 12a and 14a. Process chamber 14 includes an optical/vacuum quartz window 14b through which a facedown wafer 15 can be subjected to optical heating.

The load lock chamber maintains process cleanliness, and improves overall process reproducibility and throughput. The process chamber design prevents cross-contamination and depositions on the wafer backside and on the optical/vacuum quartz window, and allows in-situ chamber cleaning after each wafer processing if necessary.

A tungsten-halogen lamp module 16 is used for facedown wafer heating. The lamp heating module is connected to a lamp module power supply 18 that preferably operates in a closed-loop wafer-temperature-control mode by using a noninvasive wafer temperature sensor.

The reactor includes a gas distribution network 20 with nonplasma and plasma gas manifolds 22 and 24 for injection of process gases into process chamber 14. Gas distribution network 20 includes multiple mass-flow controllers for various process gases, including germane, hydrogen, HCl/HBr, HF, dopants, silane, argon and dichlorosilane.

A microwave source 26 and a discharge cavity 28 are used to provide a remotely-generated plasma stream for gases injected via plasma quartz tube 24. The plasma stream provides an additional process energy activation source.

A vacuum pump module 30 includes pumping and vacuum components coupled to load lock chamber 12 and process chamber 14 through respective vacuum couplers 12a and 14a. The base pressure in the reactor is on the order of $1 \times 10^{-6}$ Torr using turbo molecular pumps, which provide a sufficiently clean process environment for most practical applications.

A process control computer 40 controls the reactor operation, and downloads the desired multicycle process recipe.

The use of the AVM reactor 10 is exemplary, and the low-temperature in-situ dry cleaning process of the invention is readily adaptable to other wafer processing reactor configurations. In particular, the dry cleaning process may be used in multi-wafer batch furnaces to provide germane-assisted low-temperature in-situ dry cleaning for the removal of native oxides and other contaminants.

3. Dry Cleaning Process

Figure 2:
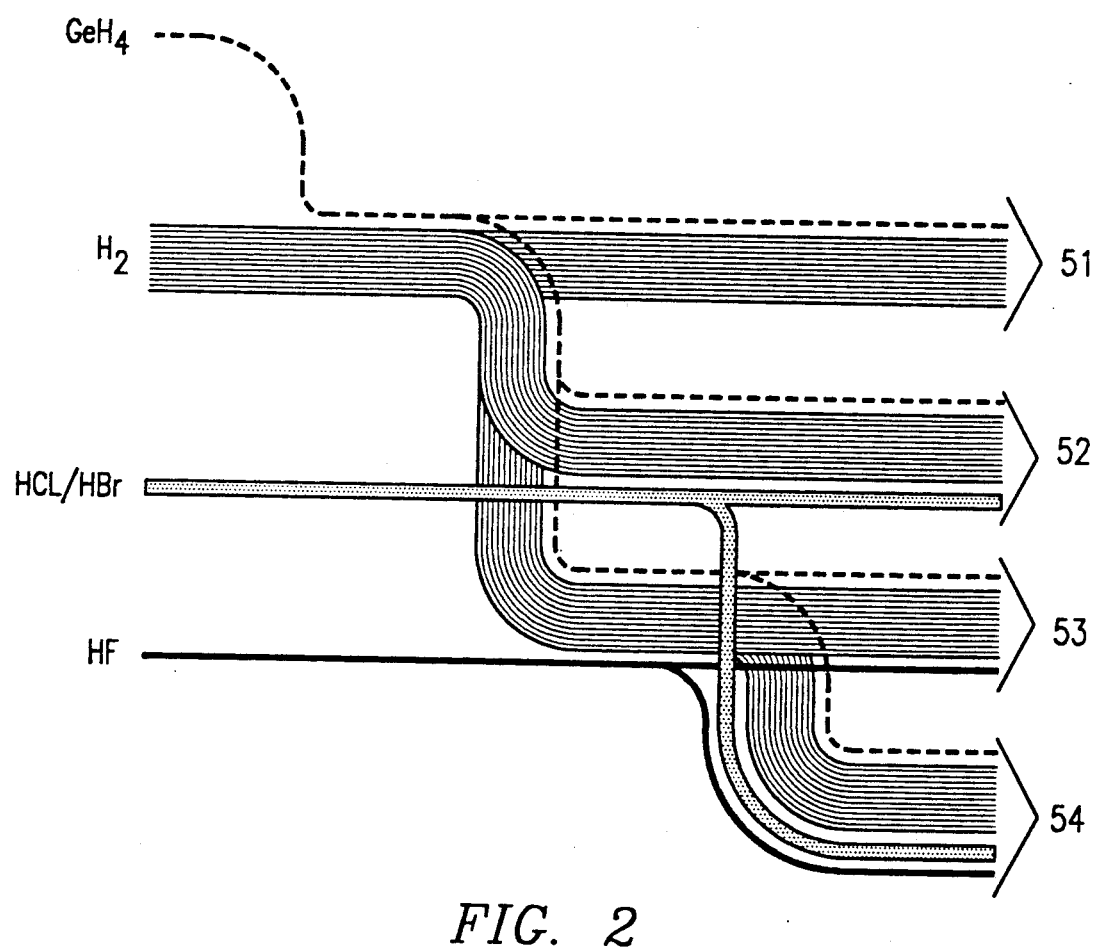
FIG. 2 illustrates alternate dry cleaning process mixtures of germane (GeH$_4$) and the various medium gases H$_2$, HCl/HBr and anhydrous HF.

FIG. 2 illustrates various exemplary $GeH_4$ dry cleaning process streams. These include: (a) a $GeH_4+H_2$ stream 51; (b) a $GeH_4+H_2+HCl/HBr$ stream 52; (c) a $GeH_4+H_2+HF$ stream 53; and (d) a $GeH_4+H_2+HCl/HBR+HF$ stream 54. These exemplary process streams are described in Sections 3.1-3.3.

Referring to FIG. 1, the germane is introduced into process chamber 14 through nonplasma manifold 22. The nonplasma germane gas stream is introduced along with a gas medium that prevents germanium deposition and provides a clean process environment—hydrogen or a mixture of hydrogen and an inert gas (such as argon), along with the selected additives for extending the germane-assisted dry cleaning process application domain.

3.1. Germane/Hydrogen

Referring to FIG. 2, the basic process stream for the germane-assisted low-temperature in-situ dry cleaning process is to introduce the germane in a hydrogen medium: $GeH_4+H_2$ stream 51.

For an exemplary $GeH_4+H_2$ dry cleaning process (no plasma activation), the process chamber (14 in FIG. 1) is adjusted for a pressure of about 5 Torr, and a temperature in the range of 650° C. to 800° C. The process pressure may be reduced or increased if desired for the purpose of adjusting the cleaning process parameters. For instance, the pressure may vary in the range of 10 m-100 Torr, or even atmospheric pressure (760 Torr).

Process temperatures in the 650° C. to 800° C. range are low enough to prevent significant dopant redistribution and or thermal stress effects. Selecting a specific process temperature depends upon the other process parameters, such as the $GeH_4:H_2$ flow ratio and process pressure. (See, Sections 3.2 and 3.3)

A mixture of $GeH_4+H_2$ with a flow ratio of about 0.15 sccm:12000 sccm is then introduced through the nonplasma gas manifold. The relatively small $GeH_4:H_2$ flow ratio prevents germanium from being deposited on the wafer or the walls of the process chamber during the cleaning process.

Cleaning time for removing native oxide layers of about 5 to 20 Angstroms is less than about 2 minutes. This time will vary between about 15-120 seconds depending upon wafer temperature, process pressure, the process ambient, and such characteristics as native oxide thickness and stoichiometry.

After the cleaning process is complete, the process chamber is cleared of the $GeH_4+H_2$ gas mixture and other reaction cleaning gases by stopping the gas flows and pumping down the chamber to near vacuum.

As an alternative to using a $GeH_4:H_2$ cleaning process stream with a pure hydrogen diluent medium, an inert gas (such as argon or helium) can be substituted for a portion (or all) of the hydrogen gas. However, the percentage of $H_2$ should be sufficiently large to provide adequate protection against germanium deposition during the pre-clean process.

The process window for the germane-assisted dry cleaning process can be further optimized by monitoring the number of stacking faults in subsequent silicon and/or silicon-germanium epitaxial films grown on the in-situ cleaned substrates. Generally, epitaxial film quality is degraded (more stacking faults) as the cleaning temperature is raised much above 850° C., and/or the $GeH_4$:$H_2$ flow ratio is much above 0.6:6000 sccm. For the $GeH_4$:$H_2$ cleaning process stream, process temperatures much below 650° C. may result in insufficient surface cleaning or incomplete removal of the native oxide layer (if plasma activation is not used).

3.2. Halogen Additive

Referring to FIG. 2, the basic process stream for the germane-assisted dry cleaning—$GeH_4 + H_2$ (+Inert)—can be further extended to removal of trace metallic contaminants by introducing a halogen-containing gas additive: $GeH_4 + H_2 + $(HCl or HBr) stream 52.

For this process environment (no plasma activation), the process pressure and wafer temperature in the process chamber (14 in FIG. 1) can be the same as for the basic $GeH_4 + H_2$ process stream 51.

The halogen-containing gas additive, such as HCl or HBr, is introduced into the basic cleaning mixture of $GeH_4 + H_2$ through the nonplasma gas manifold (without any direct plasma discharge activation). To the basic $GeH_4$:$H_2$ process stream mixture of about 0.15 sccm $GeH_4$ and 12000 sccm $H_2$, is added an HCl/HBr gas flow of less than about 50 sccm. The addition of the HCl/HBr gas additive does not significantly affect the cleaning time for removing native oxide layers.

The HCl/HBr gas additive reacts at least with some of the trace metallic contaminants, enhancing removal of those contaminants from the wafer surface.

3.3. HF Additive

Referring to FIG. 2, the process temperature for germane-assisted dry cleaning can be further lowered (and the range of oxide thickness can be further extended) by introducing an anhydrous HF gas additive: $GeH_4 + H_2 + HF$ stream 53.

For this process stream (no plasma activation), the process pressure in the process chamber (14 in FIG. 1) can be the same as for the basic $GeH_4 + H_2$ process stream 51.

An anhydrous HF gas additive is introduced into the basic cleaning mixture of $GeH_4 + H2$ through the nonplasma gas manifold. To the basic $GeH_4H_2$ process stream flow ratio of about 0.15 sccm:12000 sccm, is added an HF gas flow rate of less than about 10 sccm. The addition of the HF gas does not significantly affect the cleaning process parameters for removing native oxide layers. However, it allows further lowering of the cleaning temperature and/or time.

The HF gas additive can lower process temperature by enhancing the germane-assisted cleaning mechanism for native oxide removal. The fluorine species along with germane contributes to the reduction reactions with the native oxide layer. The flow ratio of HF:$GeH_4$ can determine the relative effects of the fluorine and germanium species on the oxide-removal chemical reduction reactions.

Referring to FIG. 2, the HF additive can be used together with the HCl/HBr additive: $GeH_4 + H_2 + HCl/HBr + HF$ stream 54. Both additives can be used to expand the application domain of the germane-assisted dry cleaning process for both lower oxide-removal process temperatures and trace metallic contaminant removal.

3.4. Plasma Activation

The germane-assisted dry cleaning process is effective without plasma activation, although activation can be used to lower process temperatures (process activation may be done by plasma or photon irradiation).

For any of the germane-assisted cleaning process streams described in Sections 3.1–3.3, process streams 51–54 in FIG. 2, plasma activation can be achieved by injecting a remote plasma stream using the gases injected through the plasma discharge tube (24 in FIG. 1). For plasma activation, the process pressure in the process chamber (14 in FIG. 1) can be the same as for cleaning processes without plasma activation.

Plasma activation can be achieved by injecting a remote plasma stream of $H_2$, Ar/He (or other inert gas such as He or Xe), or an $H_2$+Ar/He mixture. Generally, while some or all of the germane gas and/or the HCl/HBr and HF additives can also be introduced in the plasma stream, these components of the cleaning process stream are introduced as downstream nonplasma gases.

Selecting the plasma mixture is a design choice that depends on process requirements (such as process temperature) and desired plasma parameters, such as plasma density. In particular, at relatively high plasma power levels, an $H_2$ plasma (or any fluorine-containing plasmas) may cause damage to the plasma quartz tube, causing particulate contaminants to be introduced into the process chamber. Undesirable germanium deposition in the tube and tube corrosion is also a consideration in avoiding the use of $GeH_4$, HCl/HBr or HF in the plasma stream, although the quartz tube corrosion problem can be minimized by using more stable and inert materials such as sapphire for the discharge tube (instead of quartz).

Since an inert gas plasma, such as argon or helium, does not cause corrosion or damage to the plasma discharge tube, one approach to providing plasma activation for the germane-assisted dry cleaning process is to use an inert gas plasma. Moreover, the inert gas plasma streams and metastable species can easily interact with the non-plasma-injected gas molecules, exciting them and causing process activation.

As an example, plasma activation can be accomplished by: (a) injecting an inert gas (such as Ar or He) plasma stream of about 100–1500 sccm, and then (b) introducing the basic $GeH_4$:$H_2$ 0.15:12000 sccm nonplasma cleaning process gas stream into the afterglow of the plasma discharge. Use of the inert gas plasma activation of the basic $GeH_4$:$H_2$ cleaning process can be expected to allow process temperatures to be lowered for the same throughput (i.e., about 2 minutes for the removal of native oxide layers of up to about 20 Angstroms). The precise temperature reduction value depends on various factors, such as the process parameters and plasma density.

4. Multiprocessing Methodology

The low-temperature in-situ dry cleaning process of the invention is adaptable to a multiprocessing methodology that reduces process parameter cycling for increased throughput and improved process quality and yields.

FIGS. 3a-3e are process flow diagrams illustrating multiprocessing methodologies A-E for fabricating an exemplary three-layer epitaxial structure. Each methodology uses a low-temperature in-situ dry pre-cleaning in accordance with the invention, followed by three epitaxial silicon and silicon-germanium depositions using an $H_2$ diluent medium in each step—N silicon ($DCS+H_2+AsH_3$), P+ germanium-silicon ($DCS+GeH_4+H_2+B_2H_6$), and N+ silicon ($DCS+H_2+AsH_3$). Each pair of adjacent process steps are separated by a transition period.

FIGS. 3a and 3b are process flow diagrams that illustrate current multiprocessing methodologies, as described in the Background, used in connection with the low-temperature in-situ pre-cleaning process of the invention. In Methodology A, during the transitions, the heating lamp is completely shut off, gas flows are stopped, and the process chamber is pumped down to near vacuum. As a result, the wafer temperature is reduced to near room temperature. Then the gas flows for the next deposition step are started and the chamber pressure is stabilized at the nominal process pressure before commencing the next deposition step by turning on the heating lamp to achieve the desired wafer temperature.

Methodology B is an alternative that has been used to reduce vacuum cycling by maintaining the flow of the $H_2$ gas (which is common to all three deposition steps as well as the pre-clean) during the transitions. This alternative methodology increases process throughput, and produces cleaner film interfaces due to reduced particulate contamination and reduced adsorption of the residual vacuum contaminants on the wafer surface during the transition periods.

Figure 3C:
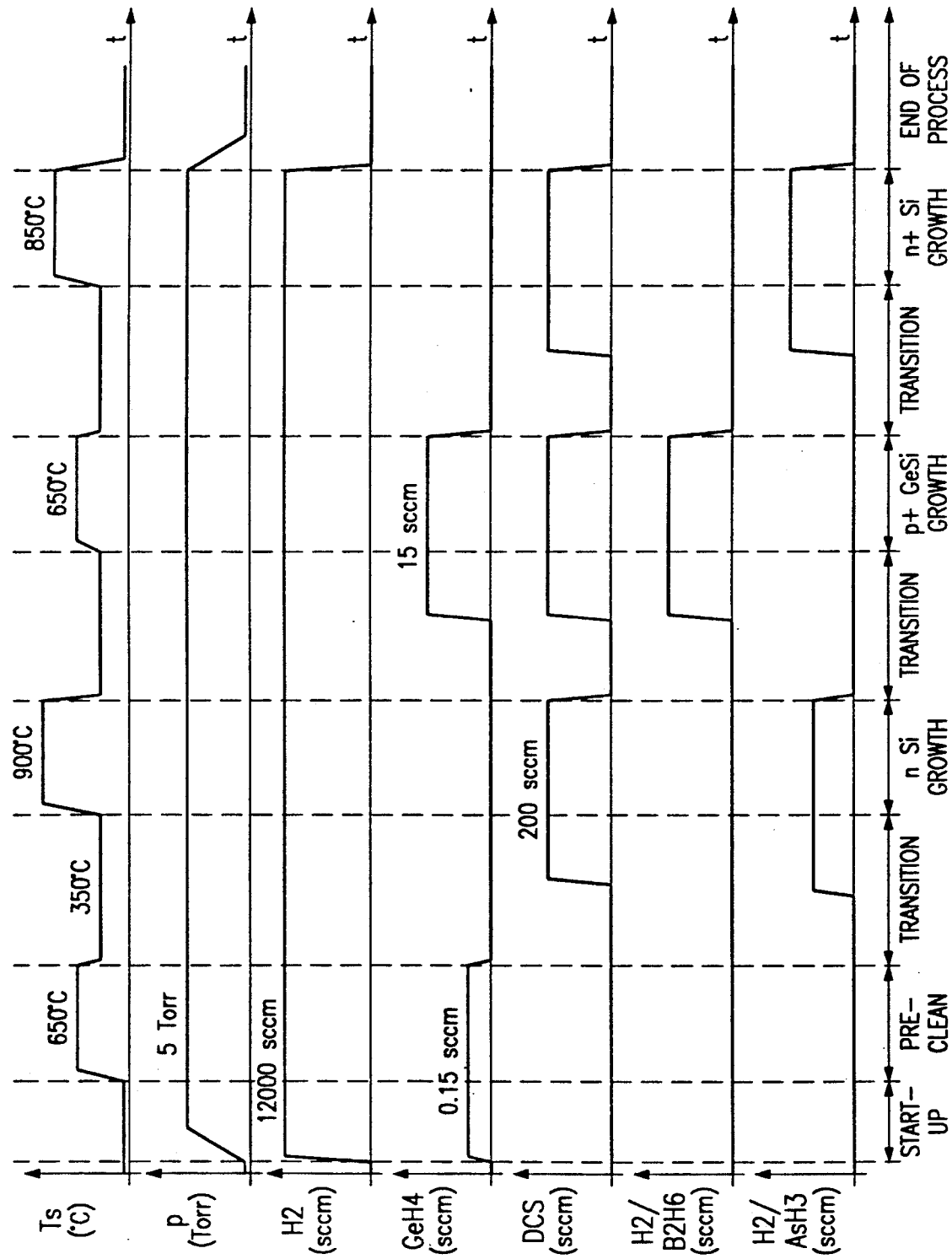
Figure 3E:
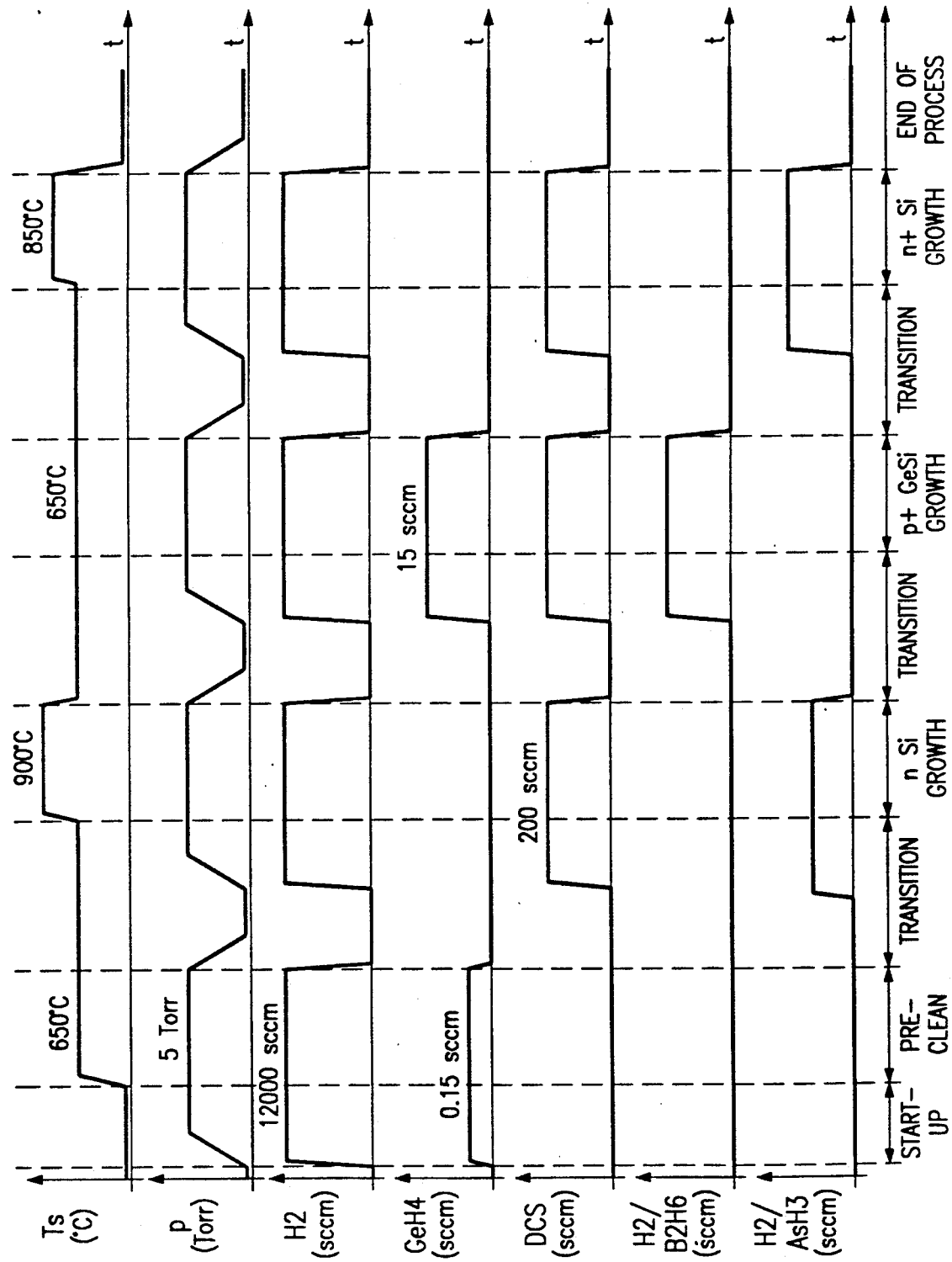

FIGS. 3c-3e are process flow diagrams illustrating multiprocessing Methodologies C-E using reduced process parameter cycling. Specifically, these methodologies each use reduced thermal cycling, and the preferred Methodology C combines reduced thermal cycling with reduced vacuum cycling.

Reduced thermal cycling is advantageous in both increasing throughput (minimizing temperature swings), and providing cleaner deposited film interfaces by inhibiting the adsorption of residual vacuum impurities ($O_2$, $H_2O$ and hydrocarbons) during the transitions. Reduced vacuum cycling (i.e., by maintaining $H_2$ gas flow during the transitions) is advantageous for increasing throughput and providing even cleaner film interfaces by reducing the particulate contamination that results from vacuum cycling (pump down and venting), and by continuous purging of the residual vacuum contaminants.

Referring to FIG. 3c, the preferred multiprocessing Methodology C reduces thermal cycling by reducing wafer temperatures during transitions only to an idle temperature of 350° C. (the idle temperature may be in the range of 150°-500° C. for epitaxial processing. This idle temperature is high enough to inhibit the adsorption of residual vacuum reactor impurities on the wafer surface, and to reduce thermal shock effects, yet is low enough to avoid any significant thermally-activated film deposition due to reactive process gases and/or dopant redistribution during the transitions. Thus, this reduced thermal cycling provides not only increased throughput and cleaner film interfaces, but also improved control over device junction profiles.

In addition to reduced thermal cycling, Methodology C uses reduced vacuum cycling. The $H_2$ medium gas flow, and process chamber pressure, are maintained constant throughout each transition, avoiding the need for process pressure cycling. If desired, an inert gas (such as Ar or He) can serve as a common gas flowing during all the process steps in a multiprocessing sequence.

Referring to FIG. 3d, multiprocessing Methodology D also maintains wafer temperatures during the transition periods at the idle temperature of about 350° C., but without maintaining $H_2$ gas flow during transition. The process environment is pumped down after stopping all the gas flows.

Referring to FIG. 3e, multiprocessing Methodology E uses a different approach to reducing thermal cycling. During transitions, wafer temperature is either (a) maintained at the temperature of the preceding completed process if the subsequent process temperature is the same or higher, or (b) reduced to the process temperature of the subsequent process if lower than the wafer temperature during the preceding completed process. This methodology minimizes wafer-temperature swings, thereby maximizing throughput and minimizing thermal shock to the wafer. However, because wafer temperatures can remain relatively high during the transitions, some undesirable dopant redistribution and wider film transition widths may be expected.

Methodology D may be modified to maintain constant gas flows as described in connection with Methodology C (FIG. 3c), thereby obtaining the advantages of avoiding process pressure cycling. Again, the constant gas may be a process gas used in all steps in a multiprocessing sequence, or an inert gas may be included in the sequence to serve as the common gas.

5. Conclusion

The germane-assisted low-temperature in-situ dry cleaning process of the invention provides a process for removing native oxides and other contaminants from a wafer prior to epitaxial growth or other processes. The germane-assisted dry cleaning process can be performed in-situ, at temperatures sufficiently low (around 650° C. to 800° C.) to avoid significant dopant redistribution or thermal stress effects. The basic $GeH_4+H_2$ cleaning gas process can be optimized by injecting selected gas additives, such as a halogen-containing gas (HCl/HBr) and/or HF. The cleaning process can be further activated by the injection of a remote plasma stream.

The low-temperature in-situ dry cleaning process is adaptable to use with either single-wafer or batch fabrication. In particular, the process can be used as the pre-cleaning step in multiprocessing methodologies that use reduced temperature cycling.

Although the invention has been described with respect to a specific, exemplary embodiment, various changes and modifications may be suggested to one skilled in the art, and it is intended that the invention encompass such changes and modifications as fall within the scope of the appended claims.

What is claimed is:

1. A method off semiconductor multiprocessing for fabricating a semiconductor wafer in a sequence of more than one process step, comprising the steps of:
   during each transition between process steps, maintaining wafer temperature at a level high enough to substantially reduce temperature swings on the wafer and the adsorption of residual process environment impurities;

during each transition between process steps in which at least one of the process gases is a common process gas used in each of the steps, maintaining the gas flow for such common process gas at substantially the same flow rate; and during each such transition, maintaining the process chamber pressure substantially the same.

2. The multiprocessing methodology of claim 1, wherein the step of maintaining wafer temperature to reduce thermal cycling effects is accomplished by reducing wafer temperature to an idle temperature that is low enough to avoid either substantial thermally-activated film deposition or substantial dopant redistribution.

3. The multiprocessing methodology of claim 2, wherein the idle temperature is about 350° C.

4. The multiprocessing methodology of claim 1, wherein the step of maintaining wafer temperature to reduce thermal cycling effects comprises the steps:

during each transition from a comparatively high process temperature to a comparatively low process temperature, reducing wafer temperature to about the low temperature;

during each transition from a comparatively low process temperature to a comparatively high process temperature, maintaining wafer temperature at about the low temperature; and during each transition from substantially identical process temperatures, maintaining wafer temperature at about that temperature.

5. The multiprocessing methodology of claim 1, wherein one of the process steps in the sequence is a pre-cleaning process comprising the steps:

setting the ambient temperature for the wafer in a range not substantially exceeding 850° C.; and contacting the device with a dry cleaning mixture of hydrogen ($H_2$) gas and germane ($GeH_4$) gas, such that the germane:hydrogen flow ratio is less than about 0.6 sccm:6000 sccm.

6. The multiprocessing methodology of claim 5, wherein the wafer temperature is in the range of 600° C. to 850° C.

7. The multiprocessing methodology of claim 6, wherein the germane:hydrogen flow ratio is about 0.15 sccm:12000 sccm.

* * * * *